United States Patent
Ronnau et al.

(10) Patent No.: US 11,829,264 B2
(45) Date of Patent: Nov. 28, 2023

(54) AUTOMATIC BACKUP AND REPLACEMENT OF A STORAGE DEVICE UPON PREDICTING FAILURE OF THE STORAGE DEVICE

(71) Applicant: Hewlett-Packard Development Company, L.P., Spring, TX (US)

(72) Inventors: Maikel Maciel Ronnau, Porto Alegre (BR); Leonardo Rodriguez Heredia, Porto Alegre (BR)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/783,039

(22) PCT Filed: Dec. 20, 2019

(86) PCT No.: PCT/US2019/067948
§ 371 (c)(1),
(2) Date: Jun. 7, 2022

(87) PCT Pub. No.: WO2021/126257
PCT Pub. Date: Jun. 24, 2021

(65) Prior Publication Data
US 2023/0017961 A1     Jan. 19, 2023

(51) Int. Cl.
*G06F 11/00*     (2006.01)
*G06F 11/14*     (2006.01)

(52) U.S. Cl.
CPC ...... *G06F 11/1469* (2013.01); *G06F 2201/84* (2013.01)

(58) Field of Classification Search
CPC .......................... G06F 11/1469; G06F 2201/84
See application file for complete search history.

(56) References Cited

U.S. PATENT DOCUMENTS

| 9,323,644 | B1 | 4/2016 | Hale et al. |
| 9,465,710 | B1 | 10/2016 | Antony |
| 9,542,296 | B1 | 1/2017 | Engers et al. |

(Continued)

OTHER PUBLICATIONS

Sun, X., et al., "System-level hardware failure prediction using deep learning", DAC' 19 proceedings of 56th annual Design Automation conference 2019, Article No. 20, pp. 1-6.

*Primary Examiner* — Joshua P Lottich
(74) *Attorney, Agent, or Firm* — QUARLES & BRADY LLP

(57) ABSTRACT

Methods, systems, and computer-readable media (transitory or non-transitory) are described herein for automatic backup and replacement of a storage device. According to an example, a storage failure for given storage device may be predicted. A backup process of the give storage device to a remote system may be initiated based on predicting the storage failure for the given storage device. The backup process may create a one-to-one image backup or a user data backup based on a predicted amount of time until the storage failure of the given storage device. A restore process of a new storage device at the remote system may be initiated upon completion of the backup process. The restore process may depend on the backup created during the backup process and/or various types of new storage devices that are available. The new storage device may be based on the given storage device.

13 Claims, 5 Drawing Sheets

(56) References Cited

U.S. PATENT DOCUMENTS

| | | |
|---|---|---|
| 10,216,558 B1 | 2/2019 | Gaber et al. |
| 10,223,224 B1 | 3/2019 | Hickey et al. |
| 2004/0249624 A1* | 12/2004 | Payne .................. G06F 3/0664 |
| | | 703/24 |
| 2005/0052772 A1* | 3/2005 | Barbian ............... G11B 27/329 |
| 2013/0318297 A1* | 11/2013 | Jibbe ................... G06F 11/2005 |
| | | 711/E12.001 |
| 2013/0326270 A1* | 12/2013 | Chen .................. G06F 11/0751 |
| | | 714/6.21 |
| 2015/0242263 A1 | 8/2015 | Klose |
| 2021/0103500 A1* | 4/2021 | Takahashi ........... G06F 11/1469 |
| 2022/0050858 A1* | 2/2022 | Karr ................... G06F 16/1748 |

\* cited by examiner

AUTOMATIC BACKUP AND REPLACEMENT OF A STORAGE DEVICE UPON PREDICTING FAILURE OF THE STORAGE DEVICE

BACKGROUND

Many storage devices, such as hard drives, include memory that store instructions for executing processes integral to operation of a corresponding electronic device, and that also store personal data of a user of the corresponding electronic device, such as documents, programs, and configurations of the corresponding electronic device. Despite the importance of these storage devices, they can be rendered inoperable and fail for a variety of reasons, including data corruption, disruption, malware, failure of various hardware components, and so on.

BRIEF DESCRIPTION OF THE DRAWINGS

Features of the present disclosure are illustrated by way of example and not limited in the following figure(s), in which like numerals indicate like elements.

DETAILED DESCRIPTION

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Further, it should be understood that the elements depicted in the accompanying figures may include other components and that some of the components described in those figures may be removed and/or modified without departing from the scope of the elements disclosed herein. It should also be understood that the elements depicted in the figures may not be drawn to scale and thus, the elements may have different sizes and/or configurations other than as shown in the figures.

Figure 1:
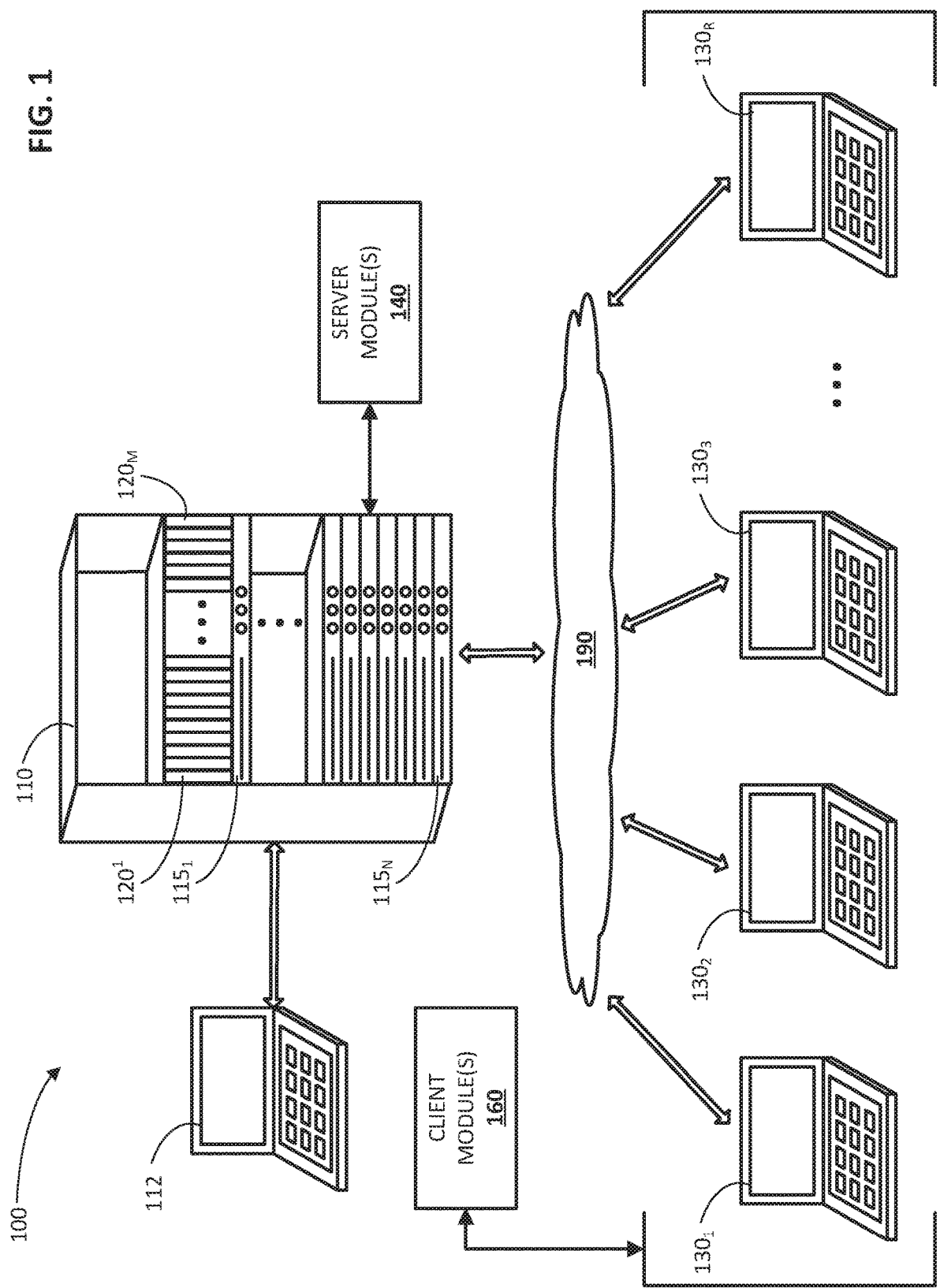
FIG. 1 depicts an example client-server environment in which automatic backup and replacement of a storage device can be implemented.

Referring now to the drawings, FIG. 1 depicts an example client-server environment 100 in which automatic backup and replacement of a storage device can be implemented. The client-server environment 100 can include a one server rack 110 having a plurality of servers $115_{1-N}$ (referred to generally as "servers 115") and a plurality of new storage devices $120_{1-M}$ (referred to generally as "new storage devices 120") connected to the servers 115 (M and N are both positive integers). Further, the client-server environment 100 can also include a plurality of user client devices $130_{1-R}$ (referred to generally as "user client devices 130"; R is a positive integer) that can communicate with the servers 115 over network(s) 190, e.g., using various types of wired and/or wireless data connections, such as wireless local area networks ("LAN") that employ technologies such as the Institute of Electrical and Electronics Engineers ("IEEE") 802.11 standards, personal area networks, mesh networks, and so forth.

Figure 2:
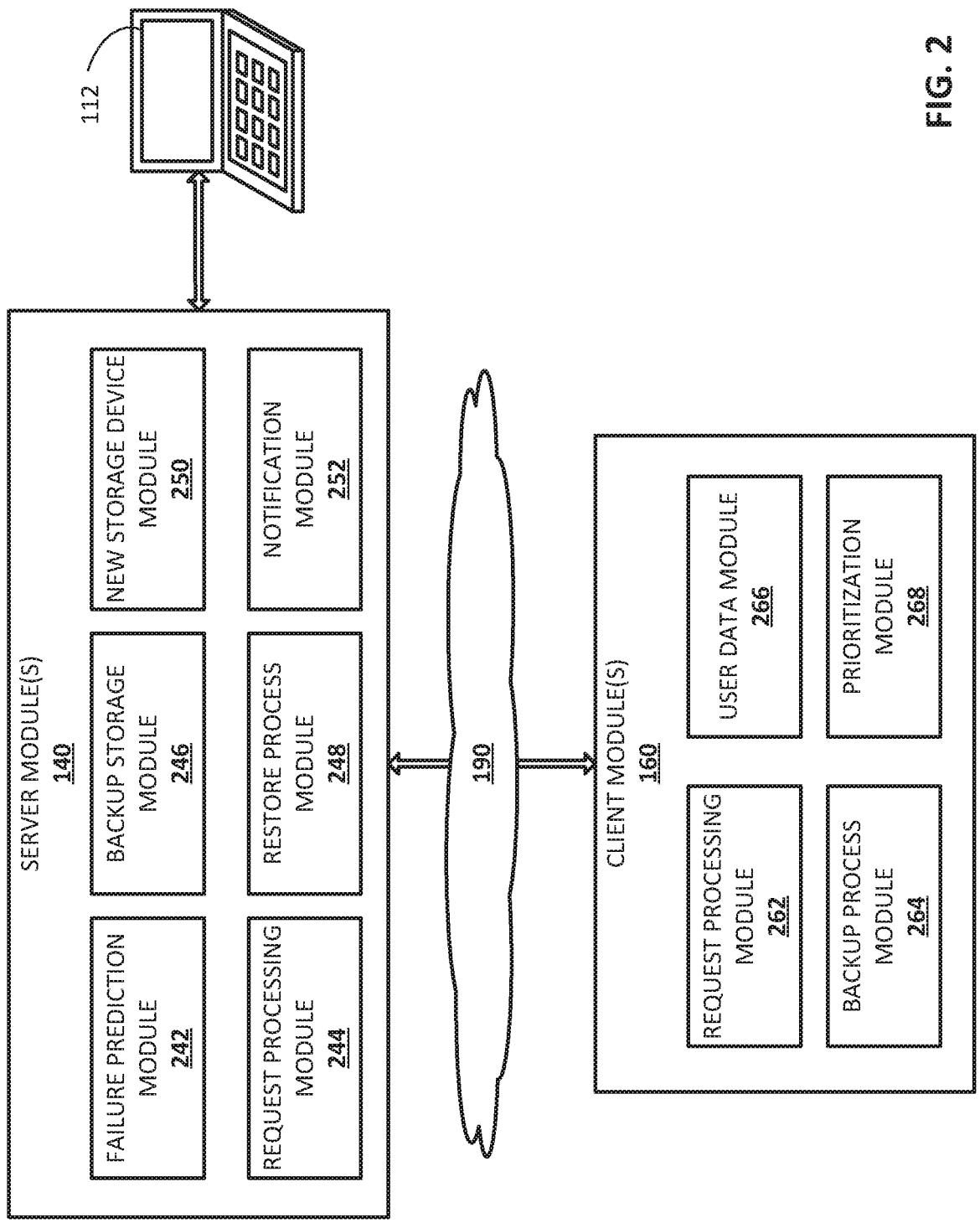
FIG. 2 depicts a block diagram of various components from the client-server environment of FIG. 1.

In some examples, any one of the servers 115 (and in some examples in conjunction with an administrator client device 112) can be utilized to implement the functionality of server module(s) 140 as described in more detail herein, e.g., with respect to FIG. 2. Generally, the server module(s) 140 can predict a storage failure for a given storage device associated with one of the user client devices 130, initiate a backup process of the given storage device to the servers 115, and initiate a restore process for a given one of the new storage devices 120. In some examples, the given storage device can be backed up locally at the user client device and transmitted to the servers 115 over the network(s) 190. In other examples, the given storage device can be backed up directly to the servers 115 over the network(s) 190.

In some examples, any user client device of the user client devices 130 can be utilized to implement the functionality of client module(s) 160 as described in more detail herein, e.g., with respect to FIG. 2. Generally, the client module(s) 160 can process requests from the server module(s) 160 to initiate a backup process of a given storage device to the server(s) 115. Further, the client module(s) 140 can cause various types of backups of the given storage device of to be created, e.g., user data backup or one-to-one image backup, and ultimately restored on a given one of the new storage devices 120. As described herein, the type of backup of the given storage device can be based on a predicted amount of time until failure of the given storage device. Although the administrator client device 112 and the user client devices 130 are depicted as laptops, this is not meant to be limiting, and in other examples, the administrator client device 112 and the user client devices 130 may take other forms, such as a tower that is operably coupled with a standalone display, a laptop computer, a convertible laptop that is convertible into a touch screen, and so forth.

In some examples, the new storage devices 120 can include, for example, primary storage devices, such as random access memory ("RAM"), secondary storage devices, such as a hard drive that is removable, internal, or external, and/or other storage devices. Further, a given one of the new storage devices 120 can be of a same type, a compatible type, or an incompatible type of storage device as a given storage device that failed (or is failing). In some examples, whether the given one of the new storage devices 120 is of the same type, the compatible type, or the incompatible type of storage device as a given storage device that failed (or is failing) can be based on parameters of the new storage device. In some of those examples, the parameters of the given one of the storage devices 120 can include, for instance, model type, memory capacity, memory access time, memory transfer rate, physical size, and/or other parameters. Further, the new storage devices 120 can be connected to the servers 115, e.g., as shown with respect to server $115_1$ and the new storage devices 120, such that the new storage devices can be easily connected and disconnected, e.g., swappable, hot swap, plug and play, and so on, as shown with respect to server $115_1$.

As noted above, the administrator client device 112 can be utilized in conjunction with the server(s) 115 to implement the functionality of server module(s) 140 as described in more detail herein, e.g., with respect to FIG. 2. The administrator client device 112 can be connected to the servers 115$_{1-N}$ over the network(s) 190. In some examples, the administrator client device 112 can help facilitate the backup process and/or restore process. For instance, the administrator client device 112 can receive, via a user interface of the administrator client device 112, and from an administrator that operates the administrator client device 112, a buffer period of time. In those instances, the type of backup of the given storage device may be determined based on a combination of the predicted amount of time until failure of the given storage device and the buffer amount of time. The buffer amount of time allows for pre-processing of data as part of the backup process, e.g., determining a type of backup, analyzing user data and/or configuration(s) for prioritization, determining where to backup (locally on a given one of the user client devices 130 or directly to one of the servers 115), and so forth. In some other example, the administrator client device 112 can receive, via the user interface of the administrator client device 112, and from the administrator that operates the administrator client device 112, a scheduled time for the backup process to occur if failure of the storage device is not imminent.

Notably, the server rack 110, the corresponding servers 115 and the new storage devices 120 can collectively be considered a remote system, and can be located at various locations. In some examples, the server rack 110 can be located at a place of business along with the user client devices 130. For instance, when a failure of a storage device associated with a given one of the user client devices 130 is predicted, a given one of the new storage devices 120 can be restored at the server rack 110 at the place of business based on a backup of the failed storage device, and the failed storage device can be easily replaced with the new storage device at the place of business. In other examples, the server rack 110 can be located independent of the user client devices 130. For instance, when a failure of a storage device associated with a given one of the user client devices 130 is predicted, a given one of the new storage devices 120 can be restored at the server rack 110 remotely and independent of the user client devices 130 based on a backup of the failed storage device, and the new storage device can be physically mailed to a user associated with the failed storage device for replacement of the failed storage device.

FIG. 2 depicts a block diagram of various components from the client-server environment 100 of FIG. 1. More particularly, FIG. 2 depicts the server module(s) 140 implemented by the servers 115 (and in some examples in conjunction with administrator client device 112) of FIG. 1 based on instructions stored in RAM of the servers 115, and client module(s) 160 implemented by user client devices 130 of FIG. 1 based on instructions stored in RAM of the each of the user client devices 130. Further, the server module(s) 140 and the client module(s) 160 can communicate over the network(s) 190 such that the server module(s) 140 can instruct the client module(s) 160 to perform operation(s) described herein.

The server module(s) 140 can include a failure prediction module 242, a request processing module 244, a backup storage module 246, a restore process module 248, a new storage device module 250, and/or a notification module 252. The client module(s) 160 can include a request processing module 262, backup process module 264, a user data module 266, and/or a prioritization module 268. Although certain operations are described herein as being performed by different modules, it should be understood that the operations can be performed in a distributed manner over the network(s), thereby leveraging computational resources of the servers 115, the user client devices 130, and/or the administrator client device 112 to perform the operations disclosed herein.

The failure prediction module 242 can predict a storage failure for a given storage device associated with a corresponding one of the client devices 130. Further, the failure prediction module 242 can also determine a predicted amount of time until the storage failure for the given storage device associated with the corresponding one of the client devices 130 will occur. Various techniques can be used to predict the storage failure and/or determine the predicted amount of time until the storage failure will occur.

In some examples, the failure prediction module 242 can collect telemetry information each of the storage devices associated with the user client devices 130, and can apply the telemetry information as input across a trained machine learning model to generate output. Based on the output, the system can determine whether there is predicted storage failure of the storage device, and, if so, determine the predicted amount of time until the predicted storage failure of the storage device.

In other examples, the failure prediction module 242 can receive signal(s) from each of the storage devices associated with the user client devices 130, and can determine whether there is predicted storage failure of the storage device based on the signal(s), e.g., hardware failure of a storage device. In some examples, a buffer amount of time can be added to the predicted amount of time until the predicted storage failure of the storage device to allow for pre-processing of data, e.g., determining a type of backup, analyzing user data and/or configuration(s) for prioritization, determining where to backup (locally on a given one of the user client devices 130 or directly to one of the servers 115), and so forth. As described herein, this pre-processing can be performed as part of the backup process by the backup process module 264, the user data module 266 and/or the prioritization modules 268.

Upon predicting a storage failure for a given storage device associated with a corresponding one of the client devices 130, the request processing module 244 of the server module(s) 140 can initiate a backup process. The backup process is described in more detail herein, e.g., with respect to FIG. 3. In some examples, the request processing module 244 of the server module(s) 140 can initiate the backup process by generating request(s) to be transmitted to the client module(s) 160. The request(s) can include an indication that the storage device of the given one of the user client devices 130 is failing, an indication of the predicted amount of time until the failure will occur (and in some examples a buffer amount of time as described herein), and/or an indication of a type of user associated with the given one of the user client devices 130.

The request processing module 262 of the client module (s) 160 can receive the request(s) generated by the request processing module 262 via the network(s) 190. Further the request processing module 262 of the client module(s) 160 can cause the backup process module 264, the user data module 266, and/or the prioritization module 268 to perform certain operations based on the predicted amount of time until the failure of a given storage device will occur. For example, if the predicted amount of time until the failure of the given storage device satisfies a temporal threshold, e.g., six hours or longer, then the request processing module 262 of the client module(s) 160 can cause, at the instruction of the servers 115, backup process module 264 to create a backup of the failing storage device locally to a corresponding one of the user client devices 130 or directly to the servers 115. However, if the predicted amount of time until the failure of the given storage device fails to satisfy a temporal threshold, e.g., two hours or less, then the request processing module 262 of the client module(s) 160 can cause, at the instruction of the servers 115, other operations to be performed, e.g., by the user data module 266 and prioritization module 268, prior to backing up the failing storage device locally to a corresponding one of the user client devices 130 or directly to the servers 115, e.g., to backup storage module 246.

Further, various types of backups can be created based on whether or not the predicted amount of time until the failure of the given storage device satisfies a temporal threshold. In some examples, the temporal threshold can be based on an estimated amount of time to create a one-to-one image backup of the failing storage device. The estimated amount of time to create a one-to-one image backup of the failing storage device can be determined by the servers 115 and/or a given one of the user client device 130 associated with the failing storage device. The one-to-one image backup of the failing storage device can be a bit-by-bit copy of the failing storage device. The bit-by-bit copy of the failing storage device can include both system data and user data, with any corrupt data being removed during the backup process of the one-to-one image backup.

In some of those examples, if the predicted amount of time until the failure of the given storage device (and in some examples including the buffer amount of time) exceeds the estimated amount of time to create the one-to-one image backup of the failing storage device, then the request processing module 262 of the client module(s), at the instruction of the servers 115, can cause the backup process module 264 to create the one-to-one image backup of the failing storage device locally on a corresponding one of the user client devices 130 or directly to the servers 115, e.g., to backup storage module 246. In some other of those examples, if the estimated amount of time to create the one-to-one image backup of the failing storage device exceeds the predicted amount of time until the failure of the given storage device (and in some examples including the buffer amount of time), then the request processing module 262 of the client module(s), at the instruction of the servers 115, can cause the backup process module 264 to create a user data backup, e.g., based on processing by the user data module 266 and prioritization module 268, of the failing storage device locally on a corresponding one of the user client devices 130 or directly to the servers 115, e.g., to backup storage module 246.

The user data backup can prioritize user data over system data, and can be created due to the predicted amount of time until the failure of the given storage device (and in some examples including the buffer amount of time) being less than the estimated amount of time to create the one-to-one image backup of the failing storage device. In other words, the user data backup can be utilized to backup as much user data as possible prior to the failure of the given storage device. The user data module 266 can be utilized in conjunction with the prioritization module 268 to determine what data to prioritize for a given user during the backup process.

In some examples, the user data module 266 can identify various configuration(s) of a given one of the user client devices 130 associated with a failing storage device. The configuration(s) can include, for example, applications installed on the given one of the user client devices 130, printer settings for the given one of the user client devices 130, desktop/wallpaper arrangements for the given one of the user client devices 130, registry information for the given one of the user client devices 130, recently and/or frequently accessed files for the given one of the user client devices 130, and/or other configuration(s). Further, in some of those examples, the user data module 266 can determine a type of user associated with the failing storage device. The type of user associated with the failing storage device can be determined, for example, based on a user profile of a user associated with the given one of the user client devices 130. The type of user can include, for example, a profession of the user, a role of the user within a business or an organization, whether the given one of the user client devices 130 is utilized for business or personal use, and so on.

In some examples, the prioritization module 268 can prioritize certain user data over other user data based on the user data module 266 determining the type of user associated with the failing storage device. The prioritization module 268 can prioritize user configuration(s) and electronic documents having certain data extensions type(s) over other electronic documents having other data extension type(s) during the backup process based on the determined type of user. For example, if the user's profession is that of a lawyer, then the prioritization module 268 may prioritize text files (e.g., .txt files, .doc files, and so on), image files (e.g., .jpg files, .png files, and so on), spreadsheets (e.g., .csv files, .xls files, and so on), and/or other frequently used/accessed electronic documents over other types of electronic documents during the backup process. In comparison, if the user's profession is that of an engineer, the prioritization module 268 may prioritize programming language files (e.g., .cpp files, .java files, and so on), draftsman files (e.g., .stp files, .vis files, and so on), and/or other frequently used/accessed electronic documents over other types of electronic documents during the backup process. Further, in some of those examples, the prioritization module 268 may ignore electronic documents having certain data extension type(s) that are available elsewhere, such as cloud-based files (e.g., .eml files, .http files, and so on).

As described herein, in some examples, the backup process module 264 can create a backup of the failing storage device locally on a corresponding one of the user client devices 130, and can transmit the created backup to the backup storage module 246 over the network(s) 190. In other examples, the backup process module 264 can create a backup of the failing storage device directly to the backup storage module 246 over the network(s) 190. Further, upon completion of a restore process of a new storage device of the new storage devices 120, the backup storage module 246 can purge the backup of the failing storage device utilized to create the new storage device, thereby conserving memory resources of the servers 115.

A restore process can be executed, for example, by the restore process module 248 in conjunction with the new storage device module 250. The restore process is described in more detail herein, e.g., with respect to FIG. 4. In some examples, the restore process module 248 can initially analyze user profile data of a user of a given one of the user client devices 130 associated with the failing storage device. In some of those examples, the restore process module 248 can determine whether the user is eligible for a new storage device based on the user profile data. In some of those examples, the restore process can be initiated in response to determining the user is eligible for the new storage device. In some of those examples, the restore process can be halted in response to determining the user is not eligible for the new storage device. Further, if the user is not eligible for the new storage device, then the user can be notified of the lack of eligibility and prompted to enroll in the restore process, e.g., using the notification module 252 and via given one of the user client devices 130 over the network(s) 190, an email address associated with the user, and so on.

In some examples, the new storage device module 250 can determine whether the restore process module 248 has access to a new storage device 120 that is of a same type as the failing storage device. The new storage device module 250 can determine the new storage device 120 is of the same type as the failing storage device based on the new storage device and the failing storage device having all of the same parameters. The parameters can include, for example, the model of the storage devices, the memory capacity of storage devices, the memory access time of the storage devices, the memory transfer rate of the storage devices, the physical size of the storage devices, and/or other parameters. Further, if the new storage device module 250 determines the restore process module 248 has access to a new storage device 120 that is of a same type as the failing storage device, then the new storage device 120 can be restored based on a type of backup created during the backup process. For instance, the new storage device can be a one-to-one image of the failing storage device (less any corrupt data) or a user data image of the failing storage device based on the user data and/or user configuration(s) prioritized during the backup process.

By contrast, if the new storage device module 250 determines the restore process module 248 does not have access to a new storage device that is of a same type as the failing storage device, then the new storage device module 250 can determine whether the restore process module 248 has access to a new storage device that is of a compatible type with the failing storage device. The new storage device module 250 can determine the new storage device is of the compatible type with the failing storage device based the new storage device and the failing storage device having some (but not all) of the same parameters. For instance, if the new storage device has the same memory capacity and same physical size as the failing storage device, but they are different models, then the new storage device and the failing storage device may not be of the same type of storage device, but they may be of the compatible type.

Further, if the new storage device module 250 determines the restore process module 248 has access to a new storage device that is of a compatible type as the failing storage device, then the new storage device can be restored based on a type of backup created during the backup process. For instance, the new storage device can be an approximate one-to-one image of the failing storage device (less any corrupt data) or a user data image of the failing storage device. Notably, if the type of backup is a one-to-one image backup and the new storage device is of the compatible type with the failing storage device (as opposed to being of the same type as the failing storage device), then an exact one-to-image may not be able to be created during the restore process due to differences in the parameters of the storage devices. However, the restore process module 248 can create the new storage device to as close as a true one-to-one image of the failing storage device as possible.

In some of those examples, if the new storage device module 250 determines the restore process module 248 does not have access to a new storage device that is of a compatible type with the failing storage device, then then the notification module 252 can render a notification via a display of the administrator client device 112 prompting the administrator to connect a new storage device the the new storage devices 120 of the server rack 110 that either of the same type as the failing storage device or compatible type with the failing storage device. Moreover, in some examples, the notification module 252 can be utilized to provide notifications to the administrator via a display of the administrator client device 112 and/or a given user via a display of the given one of the user client device 130.

For instance, the notification module 252 can provide notifications to the administrator via a display of the administrator client device 112 and over the network(s) 190. Further, the notifications can be related to: predicting storage failure of a given storage device, progress of the backup process, progress of the restore process, prompting the administrator to connect a new storage device that is of the same/compatible type as a failing storage device, completion of the restore process, interruption of the restore process, and so on. In other instances, the notification module 252 can provide notifications to the given user via a display of the given one of the user client device 130 and over the network(s) 190. Further, the notifications can be related to: predicting storage failure of a given storage device, progress of the backup process, progress of the restore process, enrollment in the restore process, completion of the restore process, interruption of the restore process, shipping details for when the new storage device will arrive, and so on.

Figure 3:
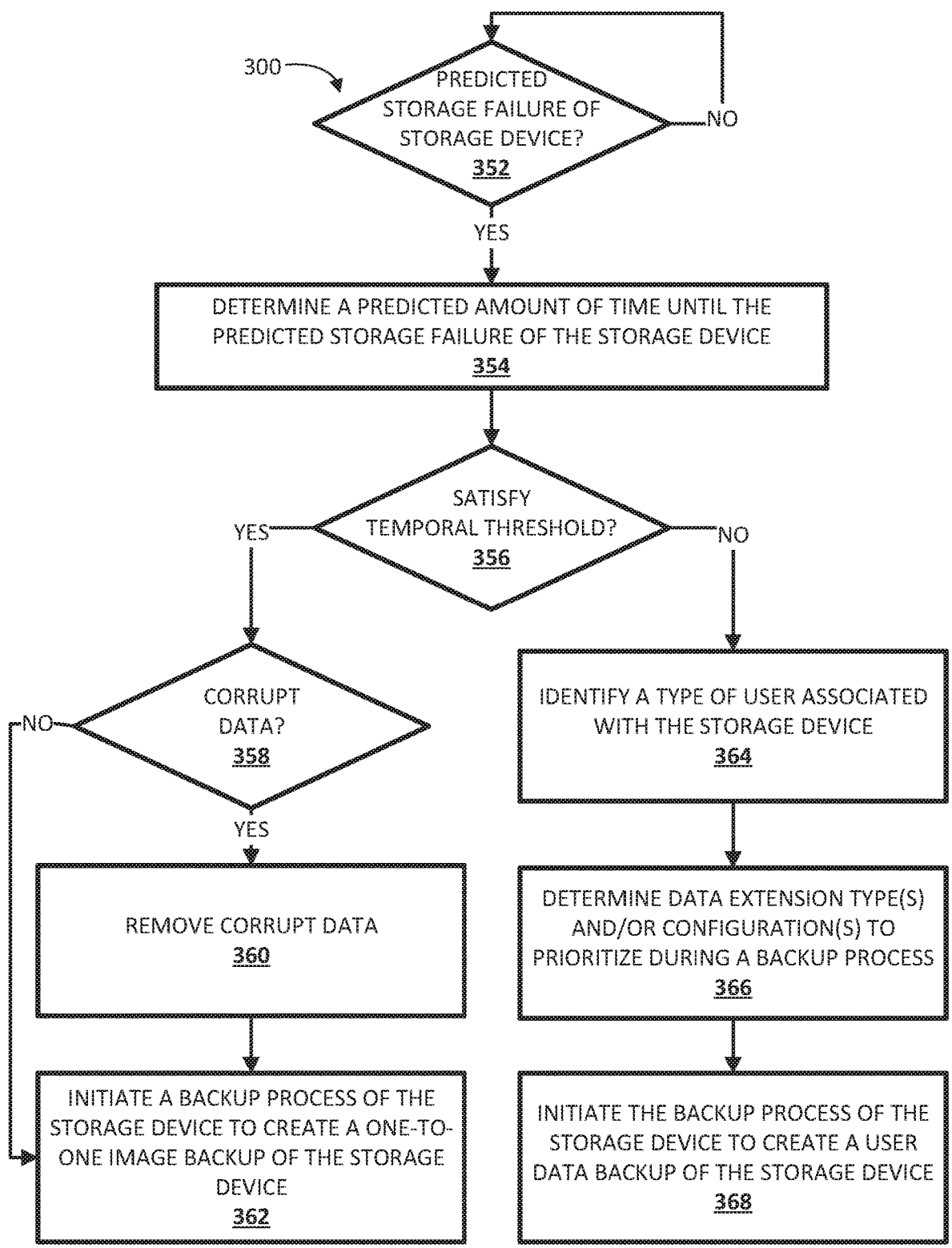
FIG. 3 depicts an example method for practicing selected aspects of the present disclosure.

FIG. 3 depicts an example method 300 for practicing selected aspects of the present disclosure. The operations of FIG. 3 can be performed by a processor, such as a processor of the various computing devices/systems described herein, including server module(s) 140 and client module(s) 160 of FIGS. 1, 2, and 5. For convenience, operations of method 300 will be described as being performed by a system configured with selected aspects of the present disclosure. Other examples may include other operations than those illustrated in FIG. 3, may perform operations (s) of FIG. 3 in a different order and/or in parallel, and/or may omit various operations of FIG. 3.

At block 352, the system may monitor for predicted storage failure of a storage device. If, at an iteration of block 352, the system does not predict any storage failure of the storage device, then the system may continue monitoring for predicted storage failure of the storage device. If, at an iteration of block 352, the system predicts storage failure of the storage device, then the system may proceed to block 354. At block 354, the system may determine a predicted amount of time until the predicted storage failure of the storage device.

In some examples, the system can collect telemetry information of the storage device, and can apply the telemetry information as input across a trained machine learning model to generate predicted output. Based on the predicted output, the system can determine whether there is predicted storage failure of the storage device, and, if so, determine the predicted amount of time until the predicted storage failure of the storage device.

In other examples, the failure prediction module 242 can receive signal(s) from each of the storage devices associated with the user client devices 130, and can determine whether there is predicted storage failure of the storage device based on the signal(s), e.g., hardware failure. In some examples, a buffer amount of time can be added to the predicted amount of time until the predicted storage failure of the storage device to allow for pre-processing of data as part of the backup process, e.g., determining a type of backup, analyzing user data and/or configuration(s) for prioritization, determining where to backup (locally on a given one of the user client devices 130 or directly to one of the servers 115), and so forth.

At block 356, the system may determine whether the predicted amount of time until the predicted storage failure of the storage satisfies a temporal threshold. The temporal threshold can be dynamic for each storage device in that it can be based on an predicted amount of time to create a one-to-one image backup of a given storage device. Further, the temporal threshold can also include a buffer amount of time beyond the predicted amount of time to back up the one-to-one image of the given storage device to prevent interruption during creation of the one-to-one image backup of the given storage device.

If, at an iteration of block 356, the system determines the predicted amount of time until the predicted storage failure satisfies the temporal threshold, e.g., failure of the storage device will likely occur subsequent to creating a one-to-one image backup of the storage device, the system may proceed to block 358. At block 358, the system may determine whether the storage device includes any corrupt data. The corrupt data can include, for example, detected corrupt data, previously undetected corrupt data, malware, or other corrupt data. If, at an iteration of block 358, the system determines the storage device includes corrupt data, then the system may proceed to block 360. At block 360, the system may remove any corrupt data from the storage device, and the system may proceed to block 362. If at an iteration of block 358, the system determines the storage device does not include corrupt data, then the system may bypass block 360 and proceed to block 362.

At block 362, the system may initiate a backup process of the storage device to create a one-to-one image backup of the storage device. The one-to-one image backup of the storage device can include a bit-by-bit copy of the storage device, including both system data and user data. The one-to-one image backup is described in more detail herein, e.g., with respect to FIG. 2.

If, at an iteration of block 356, the system determines the predicted amount of time until the predicted storage failure fails to satisfy the temporal threshold, e.g., failure of the storage device will likely occur prior to creating a one-to-one image backup of the storage device, the system may proceed to block 364. At block 364, the system may identify a type of user associated with the storage device. At block 362, the system may determine electronic document(s) having certain data extension type(s) and/or configuration(s), user data, to prioritize during a backup process. The electronic document(s) having the certain data extension type(s) and/or configuration(s) to prioritize during a backup process can vary based on the type of user associated with storage device. Moreover, the system may ignore electronic documents having certain file extension types, such as emails (data extension type of .eml) and/or other server or cloud-based electronic documents, when the predicted amount of time until the predicted storage failure fails to satisfy the temporal threshold.

At block 368, the system may initiate the backup process of the storage device to create a user data backup of the storage device. The user data backup prioritizes, during the backup process, the electronic documents having the certain data extension type(s) and/or configuration(s) determined at block 366. If the system backs up the electronic documents having the certain data extension type(s) and/or configuration(s) prioritized at block 366 prior to failure of the storage device, the system may continue backing up other electronic documents having other data extension type(s) and/or configuration(s) that were not prioritized at block 366 until the backup process is interrupted. Further, if the system backs up the other electronic documents having the other data extension type(s) and/or configuration(s) that were not prioritized at block 366 prior to failure of the storage device, the system may continue backing up system data until the backup process is interrupted. The user data backup is described in more detail herein, e.g., with respect to FIG. 2.

Figure 4:
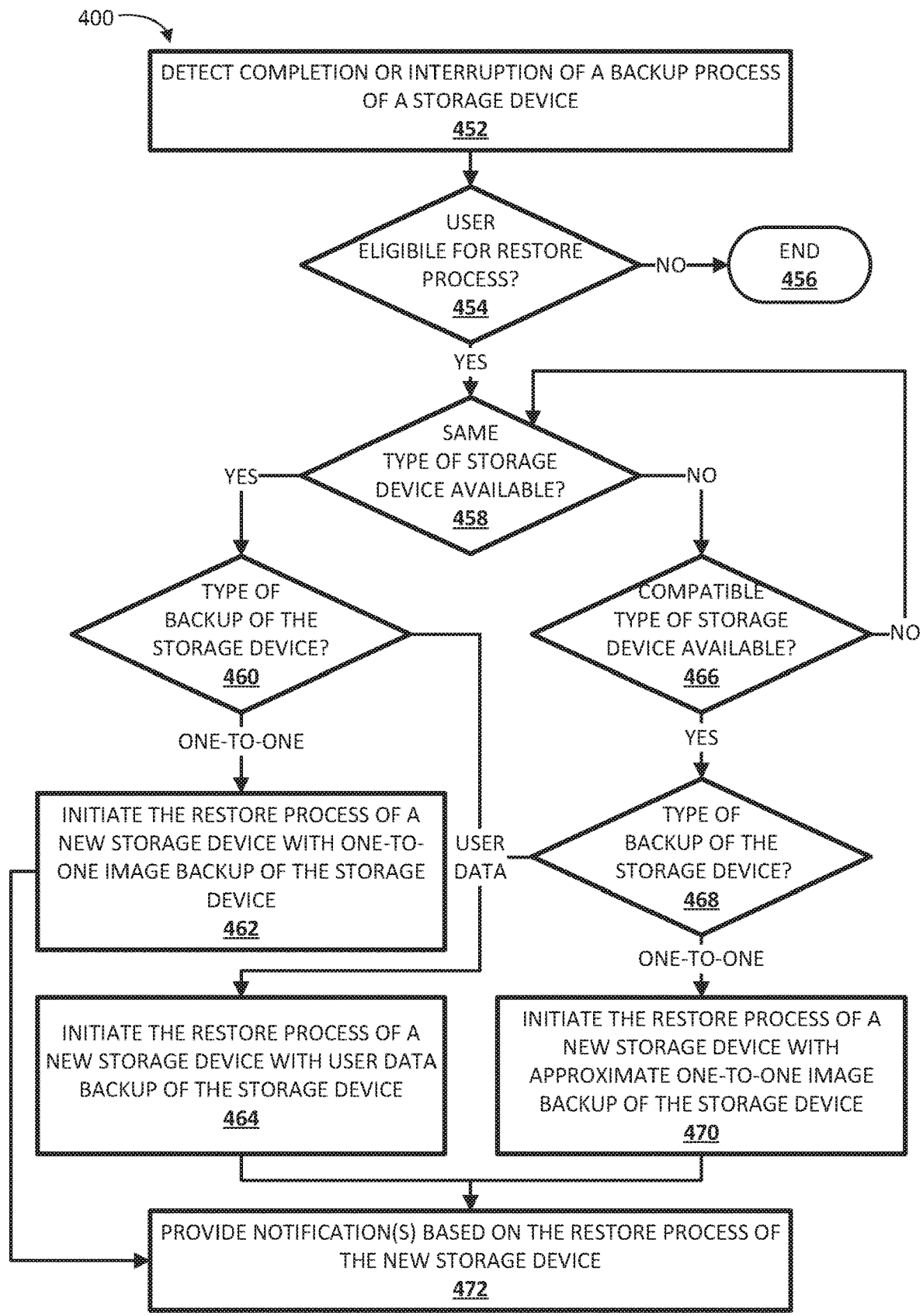
FIG. 4 depicts an example method for practicing selected aspects of the present disclosure.

FIG. 4 depicts an example method 400 for practicing selected aspects of the present disclosure. The operations of FIG. 4 can be performed by a processor, such as a processor of the various computing devices/systems described herein, including server module(s) 140 and client module(s) 160 of FIGS. 1, 2, and 5. For convenience, operations of method 400 will be described as being performed by a system configured with selected aspects of the present disclosure. Other examples may include other operations than those illustrated in FIG. 4, may perform operations (s) of FIG. 4 in a different order and/or in parallel, and/or may omit various operations of FIG. 4.

At block 452, the system may detect completion or interruption of a backup process of a storage device. At block 454, the system may determine user eligibility, e.g., of a user that operates a client device 130 that includes the storage device, for a restore process. If, at an iteration of block 454, the system determines the user associated with the storage device is not eligible for the restore process, the system may proceed to block 456 and the method 400 ends. The user associated with the storage device may be prompted to enroll in the restore process for the restore process to resume at block 458. If, at an iteration of block 454, the system determines the user associated with the storage device is eligible for the restore process, the system may proceed to block 458.

At block 458, the system may determine whether a same type of storage device, as the storage device that failed (or is failing), is available. The storage device can be a primary storage device, such as random access memory ("RAM"), a secondary storage device, such as a hard drive that is removable, internal, or external, or other storage devices. A new storage device can be of the same type of storage device as the storage device that failed (or is failing) if all parameters of the new storage device are the same as the storage device that failed (or is failing). For example, the new storage can be considered of the same type as the storage device that failed (or is failing) if they are the same model of storage device, have the same memory capacity, the same memory access time, the same memory transfer rate, the same physical size, and other parameters that are the same. If, at an iteration of block 458, the system determines the same type of storage device, as the storage device that failed (or is failing), is available, the system may proceed to block 460.

At block 460, the system may determine a type of backup for the storage device. The type of backup may include a one-to-one image backup of the given storage device, or a user data backup of the given storage device, or other types of backups. The one-to-one image backup of the given storage device can include a bit-by-bit copy of the storage device. The user data backup of the given storage device can include various electronic documents having certain data extension type(s) and/or configuration(s) that were prioritized during the backup process. The backup process is described in more detail herein, e.g., with respect to FIG. 3.

If, at an iteration of block 460, the system determines the type of backup is a one-to-one image backup, the system may proceed to block 462. At block 462, the system may initiate the restore process of a new storage device with the one-to-one image backup of the storage device that failed (or is failing). The restore process with the one-to-one image backup can include transferring the bit-by-bit image of the storage device that failed (or is failing) to the new storage device. Notably, based determinations at blocks 458 and 460, the new storage device is of a same type as the given storage device, and the new storage device includes a one-to-one image of the given storage device. The system may then proceed to block 472.

If, at an iteration of block 460, the system determines the type of backup is a user data backup, the system may proceed to block 464. At block 464, the system may initiate the restore process of a new storage device with the user data backup of the storage device that failed (or is failing). The restore process with the user data backup can include transferring various electronic documents having certain data extension type(s) and/or configuration(s) to the new storage device. Notably, based determinations at blocks 458 and 460, the new storage device is of a same type as the given storage device, and the new storage device is a user data backup of the given storage device. The system may then proceed to block 472.

If, at an iteration of block 458, the system determines the same type of storage device is not available, as the storage device that failed (or is failing), the system may proceed to block 466. At block 466, the system may determine whether a compatible type of storage device available, with the given storage device that failed (or is failing). A new storage device 120 can be of the compatible type of storage device with the storage device that failed (or is failing) if some parameters of the new storage device are compatible with the storage device that failed (or is failing). In some examples, the new storage device 120 can be considered of the compatible type with the storage device that failed (or is failing) if they have the same memory access time and the same physical size, but not the same memory capacity or the same memory transfer rate. In some examples, the new storage device may not be considered of the compatible type with the storage device that failed (or is failing) if, for instance, the two devices have the same memory capacity, the same memory access time, the same memory transfer rate, but not the same physical size.

If, at an iteration of block 466, the system determines there is no compatible type of storage device available, with the storage device that failed (or is failing), the system may return to block 458. In this manner, the system can monitor for the availability of a new storage device that is of a same type as the storage device that failed (or is failing), or that is of a compatible type with the storage device that failed (or is failing). If, at an iteration of block 466, the system determines there is a compatible type of storage device available, with the storage device that failed (or is failing), the system may proceed to block 468.

At block 468, like at block 460, the system may determine a type of backup for the given storage device. The type of backup may include a one-to-one image backup of the given storage device, or a user data backup of the given storage device, or other types of backups. The one-to-one image backup of the given storage device can include a bit-by-bit copy of the storage device. The user data backup of the given storage device can include various electronic documents having certain data extension type(s) and/or configuration(s) that were prioritized during the backup process. The backup process is described in more detail herein, e.g., with respect to FIG. 3.

If, at an iteration of block 468, the system determines the type of backup is a one-to-one image backup, the system may proceed to block 470. At block 470, the system may initiate the restore process of a new storage device with an approximate one-to-one image backup of the storage device that failed (or is failing). The one-to-one image backup can be considered an approximate one-to-one image backup since the new storage device is of a compatible type that shares some parameters with the storage device that failed (or is failing), but does not share all the same parameters. Accordingly, the restore process with the one-to-one image backup can include transferring the bit-by-bit image of the storage device to the new storage device as closely as possible, but the new storage device may not be an exact one-to-one image of the storage device that failed (or is failing). Notably, based determinations at blocks 458 and 468, the new storage device is of a compatible type with the storage device that failed (or is failing), and the new storage device is an approximate one-to-one image backup of the storage device that failed (or is failing). The system may then proceed to block 472.

If, at an iteration of block 468, the system determines the type of backup is a user data backup, the system may proceed to block 464. At block 464, the system may initiate the restore process of a new storage device with the user data backup of the storage device that failed (or is failing). The restore process with the user data backup can include transferring various electronic documents having certain data extension type(s) and/or configuration(s) to the new storage device. Notably, based determinations at blocks 458 and 468, the new storage device is of a compatible type with the storage device that failed (or is failing), and the new storage device is a user data backup of the storage device that failed (or is failing). The system may then proceed to block 472.

At block 472, the system may provide notification(s) based on the restore process of the new storage device. The system may provide various notifications to an administrator of the restore process throughout the restore process, and the notifications can be rendered on a client device of the administrator of the restore process. For example, the notification provided the administrator can include, for example, an indication that there is no new storage device of the same type and/or of the compatible type as the storage device that failed (or is failing), an indication of progress of the restore process, an indication that a restore process was completed or interrupted, an indication that the restore process was performed, and/or a location of the new storage device. Further, the system may also provide various notifications to a user associated with the storage device that the restore process of the new storage device is complete or interrupted, and the notifications can be rendered on a client device of the user associated with the storage device. For example, the notification provided the user associated with the storage device can include, for example, an indication that the storage device failed, an indication that the restore process was performed, and/or a location of the new storage device.

Accordingly, techniques described herein enable the automatic backup and replacement of a given storage device when failure of the given storage device is imminent. By automatically backing up and replacing the given storage device that is predicted to fail, data loss on client device(s) associated with the given storage device can be prevented. For instance, if a prediction of a storage failure of the given storage device is determined at 1:00 AM and a predicted amount of time until failure of the given storage device is four hours, e.g., 5:00 AM, then it unlikely a user and/or administrator will be able to initiate a backup process prior to the failure of the given storage device absent these techniques. Further, by restoring the user device with the user configuration(s), a quantity of user inputs at the given client device can be greatly reduced upon replacement of the given storage device with a new storage device by obviating the need for re-configurations upon restarting the given client device that includes the new storage device.

Figure 5:
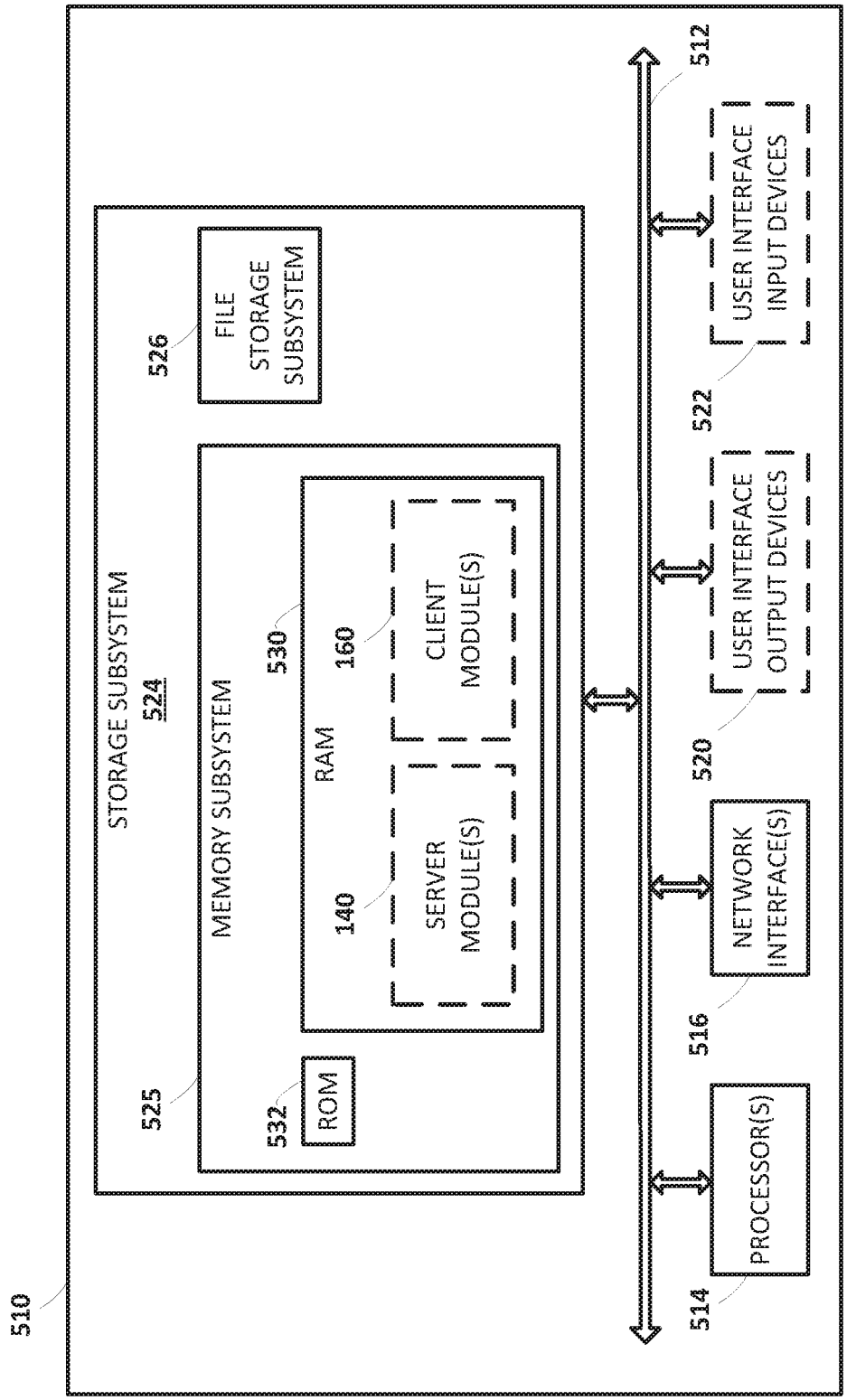
FIG. 5 shows a schematic representation of a computing device, according to an example of the present disclosure.

FIG. 5 is a block diagram of an example computer system 510. Computer system 510 can be of varying types including a server, client device, workstation, computing cluster, blade server, server farm, or any other data processing system or computing device. Due to the ever-changing nature of computers and networks, the description of computer system 510 depicted in FIG. 5 is intended as a specific example for purposes of illustrating some examples. Many other configurations of computer system 510 are possible having more or fewer components than the computer system depicted in FIG. Moreover, certain instances of computer system 510 may include various distinct components, e.g., an instance of a client device as compared to an instance of a server, and those differences are noted hereinbelow.

Computer system 510 includes a processor 514 which communicates with a number of peripheral devices via bus subsystem 512. These peripheral devices may include a storage subsystem 526, including, for example, a memory subsystem 525 and a file storage subsystem 526, and a network interface subsystem 516. Network interface subsystem 516 provides an interface to outside networks and is coupled to corresponding interface devices in other computer systems.

In instances where the computer system 510 is a server, e.g., the servers 115, the computer system 510 can omit user interface input devices 522 and user interface output devices 520. In instances where the computer system 510 is a client device, e.g., the administrator client device 112 or the user client devices 130, the computer system 510 can further include the user interface input devices 522 and the user interface output devices 520 to allow user interaction with computer system 510.

The user interface input devices 522 may include input devices such as a keyboard, pointing devices such as a mouse, trackball, a scanner, a touchscreen incorporated into the display, audio input devices such as voice recognition systems, microphones, and/or other types of input devices. In general, use of the term "input device" is intended to include all possible types of devices and ways to input information into computer system 510 or onto a communication network.

The user interface output devices 520 may include a display subsystem that includes a display, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 510 to the user or to another machine or computer system.

Storage subsystem 526 stores programming and data constructs that provide the functionality of some or all of the modules described herein. For example, the storage subsystem 526 may include the logic to perform selected aspects of methods 300 and 400.

These machine-readable instruction modules are executed by processor 514 alone or in combination with other processors. Memory 525 used in the storage subsystem 526 can include a number of memories including a main random access memory (RAM) 530 for storage of instructions and data during program execution and a read only memory (ROM) 532 in which fixed instructions are stored. In instances where the computer system 510 is a server, e.g., the servers 115, the RAM 530 can include instructions to execute server module(s) 140, but not the client module(s) 160. In instances where the computer system 510 is a client device, e.g., the administrator client device 112 or the user client devices 130, the RAM 530 can include instructions to execute client module(s) 160, but not the server module(s) 140.

A file storage subsystem 526 can provide persistent storage for program and data files, and may include a hard disk drive, a floppy disk drive along with associated removable media, a CD-ROM drive, an optical drive, or removable media cartridges. The modules implementing the functionality of certain examples may be stored by file storage subsystem 526 in the storage subsystem 526, or in other machines accessible by the processor(s) 514.

Bus subsystem 512 provides a mechanism for letting the various components and subsystems of computer system 510 communicate with each other as intended. Although bus subsystem 512 is shown schematically as a single bus, other examples of the bus subsystem may use multiple busses.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration and are not meant as limitations. Many variations are possible within the spirit and scope of the disclosure, which is intended to be defined by the following claims—their equivalents—in which all terms are meant in their broadest reasonable sense unless otherwise indicated.

What is claimed is:

1. A method for automatically backing up and replacing a storage device, the method comprising:
   determining a predicted amount of time until a storage failure for a given storage device;
   predicting the storage failure for the given storage device;
   initiating, based on predicting the storage failure for the given storage device, a backup process of the given storage device to a remote system;
   initiating, upon completion of the backup process, a restore process of a new storage device at the remote system, the new storage device being based on the given storage device; and
   providing, upon completion of the restore process, a notification indicating the restore process of the new storage device is complete,
   wherein initiating the backup process of the given storage device to the remote system comprises:
      prioritizing, based on the predicted amount of time failing to satisfy a temporal threshold, user data over system data during the backup process, and wherein prioritizing the user data over the system data during the backup process comprises;
      identifying a type of user associated with the given storage device;
      and
         determining, based on the identified type of user associated with the given storage device, a plurality of data extension types or a plurality of user configurations to prioritize during the backup process.

2. The method of claim 1, wherein determining the data extension types to prioritize during the backup process is further based on a frequency of use of documents having the data extension types prior to predicting the storage failure for the given storage device.

3. The method of claim 1, wherein initiating the backup process of the given storage device to the remote system comprises creating, based on the predicted amount of time satisfying a temporal threshold, a one-to-one image of the given storage device during the backup process, and wherein creating the one-to-one image of the given storage device comprises:
   removing data of the given storage device that is corrupted; and
   copying remaining data of the given storage device bit-by-bit.

4. A non-transitory computer-readable medium comprising instructions that, in response to execution of the instructions by a processor, cause the processor to:
   determining a predicted amount of time until a storage failure for a given storage device;
   predict the storage failure for the given storage device;
   initiate, based on predicting the storage failure for the given storage device, a backup process of the given storage device to a remote system;
   determine whether the remote system has access to a new storage device that is of a same type as the given storage device; and
   initiate, upon completion of the backup process, based on determining the remote system does not have access to the new storage device that is of the same type as the given storage device, a restore process of the new storage device at the remote system, the new storage device being based on the given storage device, and the new storage device being of a compatible type with the given storage device,
      wherein initiating the backup process of the given storage device to the remote system comprises:
         prioritizing, based on the predicted amount of time failing to satisfy a temporal threshold, user data over system data during the backup process, and wherein prioritizing the user data over the system data during the backup process comprises:
            identifying a type of user associated with the given storage device; and
            determining, based on the identified type of user associated with the given storage device, a plurality of data extension types or a plurality of user configurations to prioritize during the backup process.

5. The non-transitory computer-readable medium of claim 4, further comprising instructions to:
   determine, based on user profile data of a user of the given storage device, whether the user is eligible for the new storage device; and
   in response to the determination the user is eligible for the new storage device, initiate the restore process.

6. The non-transitory computer-readable medium of claim 4, further comprising instructions to:
   determine the new storage device is of the compatible type with the given storage device.

7. The non-transitory computer-readable medium of claim 6, comprising instructions to create the new storage device as an approximate one-to-one image of the given storage device.

8. The non-transitory computer-readable medium of claim 6, further comprising instructions to create the new storage device based on a plurality of user data and a plurality of user configurations of the given storage device, wherein the backup process prioritizes the plurality of user data and the plurality of user configurations of the given storage device based on frequency of use.

9. The non-transitory computer-readable medium of claim 4, further comprising instructions to:
   provide, upon completion of the restore process, a notification indicating the restore process of the new storage device is complete.

10. The non-transitory computer-readable medium of claim 4, wherein the remote system is located a place of business along with a computing device associated with the given storage device.

11. The non-transitory computer-readable medium of claim 4, wherein the remote system is located at a remote location independent of a computing device associated with the given storage device.

12. A system for automatically backing up and replacing of a storage device, the system comprising a processor to:
   determine a predicted amount of time until a storage failure for a given storage device;
   determine that the given storage device has been predicted to undergo the storage failure;
   initiate, based on the predicted storage failure, a backup process of the given storage device;
   determine whether the system has access to a new storage device that is of a same type as the given storage device; and
   initiate, upon completion of the backup process, and based on a determination that the system does have access to the new storage device that is of the same type as the given storage device, a restore process of the new storage device at the remote system,
      wherein the restore process restores the new storage device based on the given storage device,
      wherein the new storage device is of the same type as the given storage device,
      wherein initiating the backup process of the given storage device to the remote system comprises:
         prioritizing, based on the predicted amount of time failing to satisfy a temporal threshold, user data over system data during the backup process, and wherein prioritizing the user data over the system data during the backup process comprises:
            identifying a type of user associated with the given storage device;
            and
            determining, based on the identified type of user associated with the given storage device, a plurality of data extension types or a plurality of user configurations to prioritize during the backup process.

13. The system of claim 12, wherein the processor is to:
   determine whether the backup process is able to create a one-to-one image of the given storage device;
   in response to a determination that the backup process is able to create the one-to-one image of the given storage device, create of the new storage device as a one-to-one image of the given storage device; and in response to a determination that the backup process is unable to create the one-to-one image of the given storage device, create the new storage device based on a plurality of user data and a plurality of user configurations of the given storage device.

* * * * *